(12) United States Patent
Kubota et al.

(10) Patent No.: US 6,790,543 B2
(45) Date of Patent: Sep. 14, 2004

(54) HARD LAYER-COATED TOOL

(75) Inventors: Kazuyuki Kubota, Chiba-ken (JP); Nobuhiko Shima, Chiba-ken (JP)

(73) Assignee: Hitachi Tool Engineering, Ltd., Tokyo (JP)

(*) Notice: Subject to any disclaimer, the term of this patent is extended or adjusted under 35 U.S.C. 154(b) by 0 days.

(21) Appl. No.: 10/289,388

(22) Filed: Nov. 7, 2002

(65) Prior Publication Data

US 2003/0148146 A1 Aug. 7, 2003

(30) Foreign Application Priority Data

Nov. 7, 2001 (JP) .......................................... 2001-342094
Aug. 23, 2002 (JP) .......................................... 2002-243323
Sep. 24, 2002 (JP) .......................................... 2002-276904

(51) Int. Cl.[7] ............................................. C23C 14/00
(52) U.S. Cl. ............................ 428/698; 51/307; 51/309; 428/336; 428/697; 428/699; 428/701; 428/702; 428/704
(58) Field of Search ........................ 428/704, 701, 428/702, 698, 697, 699, 336; 51/307, 309

(56) References Cited

U.S. PATENT DOCUMENTS 4,599,281 A * 7/1986 Schintlmeister et al.
4,895,770 A * 1/1990 Schintlmeister et al.
5,318,840 A * 6/1994 Ikeda et al.
5,851,680 A * 12/1998 Heau
6,200,649 B1 * 3/2001 Dearnaley

FOREIGN PATENT DOCUMENTS

| DE | 3434616 | * 6/1997 |
| JP | 57032366 | * 2/1982 |
| JP | 58067858 | * 4/1983 |
| JP | 03260054 | * 11/1991 |
| JP | 09202966 | * 8/1997 |
| JP | 2001269801 | * 10/2001 |

* cited by examiner

Primary Examiner—Archene Turner
(74) Attorney, Agent, or Firm—Sughrue Mion, PLLC (57) ABSTRACT

A tool coated with a hard Ti/B layer having fine boron nitride particles dispersed therein, wherein the bonding energy of B and N is observed in an ESCA analysis of the hard coating layer; wherein peaks of c-BN and h-BN is detected in an Raman spectroscopy of the hard coating layer; wherein a ratio $Q_1/Q_2$ of a peak intensity $Q_1$ of c-BN to a peak intensity $Q_2$ of h-BN is 1.0 or more; wherein a half-value width Z of a (200) face in an X-ray diffraction of the hard coating layer is in a range of 0.3° to 0.6°; and wherein a ratio K/L of a face thickness K to a flank thickness L in the tool is 1.0 or more, whereby the hard coating layer has high hardness, high lubricating properties and excellent crater wear resistance, with chemical reactions with a work suppressed.

8 Claims, 6 Drawing Sheets

Fig. 6

HARD LAYER-COATED TOOL

FIELD OF THE INVENTION

The present invention relates to a hard layer-coated tool used for cutting metal materials, etc., particularly to a hard layer-coated tool having excellent crater wear resistance for use in high-speed cutting and dry cutting.

BACKGROUND OF THE INVENTION

Cutting tools coated with TiN, Ti (CN), (TiAl)N, etc. are conventionally used widely. However, layers of TiN or Ti (CN) fail to exhibit sufficient oxidation resistance and wear resistance during high-speed cutting. Because a (TiAl)N layer has superior oxidation resistance to that of TiN and Ti (CN), it is used under cutting conditions that a tool edge tip is subjected to high temperatures. However, seizure occurs at a tool edge tip during cutting at high temperatures, failing to achieve sufficient tool life.

JP 2001-293601 A discloses a wear-resistant TiN layer containing fine compound particles of BN, $TiB_2$, TiB, etc. It is described in this reference that these fine compound particles are amorphous and have function to improve the hardness of the layer. Though these fine compound particles contribute to improvement in wear resistance, slidability, seizure resistance, and working precision, this reference fails to teach in detail the properties and form of the fine compound particles.

OBJECT OF THE INVENTION

An object of the present invention is to provide a hard layer-coated tool suitable for a dry cutting operation at a high speed and a high feed, which is provided with improved seizure resistance at high temperatures and suppressed diffusion of elements in a work to a hard coating layer, without sacrificing the wear resistance and adhesion of a hard (TiAl)N coating layer, etc. having excellent oxidation resistance.

DISCLOSURE OF THE INVENTION

As a result of intensive research in view of the above object, the inventors have found that in a tool having a hard coating layer formed on a substrate surface, the layer being made of any of a nitride, a carbonitride, an oxynitride and an oxycarbonitride each containing Ti and B as metal elements, when the hard coating layer is formed such that (a) a boron nitride phase is dispersed, (b) the bonding energy of B and N is observed by ESCA, and (c) the existence of c-BN and/or h-BN is observed by Raman spectroscopy, the lubricating properties of the hard Ti coating layer are improved by the lubricating properties of the BN phase, whereby its crater wear resistance is remarkably improved. The inventors have also found that in a cutting operation in a dry state at a high speed and a high feed, by suppressing a phenomenon of diffusion of elements contained in a work to a hard coating layer, no seizure of a work to a tool occurs and the crater wear resistance of a tool is remarkably improved, resulting in an extremely long tool life. The inventors have further found that necessary to improve the hardness and lubricating properties of the hard coating layer remarkably is not only the addition of B but also the optimization of the coating conditions. The present invention has been completed based on these findings.

Thus, the hard layer-coated tool of the present invention is coated with a hard layer made of any of a nitride, a carbonitride, an oxynitride and an oxycarbonitride each containing Ti and B as metal elements; wherein the hard coating layer contains a boron nitride phase; wherein the bonding energy of B and N is observed in an ESCA analysis of the hard coating layer; and wherein the existence of c-BN and/or h-BN is observed in a Raman spectroscopy of the hard coating layer.

In a preferred embodiment of the present invention, a half-value width Z of a (200) face in an X-ray diffraction of the hard coating layer is in a range of 0.3° to 0.6°; peaks of c-BN and h-BN are detected in an Raman spectroscopy of the hard coating layer; a ratio $Q_1/Q_2$ of a peak intensity $Q_1$ of c-BN to a peak intensity $Q_2$ of h-BN is 1.0 or more; and a ratio K/L of a face thickness K to a flank thickness L in the tool is 1.0 or more.

It is preferable that the hard coating layer is formed by using a target of a Ti—B alloy; and that the content of B in the hard coating layer is 0.1 to 50 atomic %, based on the total amount (100 atomic %) of metal elements. The hard coating layer may further comprises, as a layer other than the hard coating layer, a hard coating layer comprising at least one metal element selected from the group consisting of Ti, Al and Cr, and at least one non-metal element selected from the group consisting of C, O and N. Part of Al in the hard coating layer containing Ti and Al may be substituted by at least one selected from the group consisting of metals in the Groups 4a, 5a and 6a and Si.

It is preferable that a tool substrate is preferably made of cemented carbide or cermet, and that the total thickness of the hard coating layer is 3 to 15 μm on a tool face. A tool on which the hard coating layer of the present invention can be formed is preferably an insert.

DESCRIPTION OF THE PREFERRED EMBODIMENTS

Figure 1:
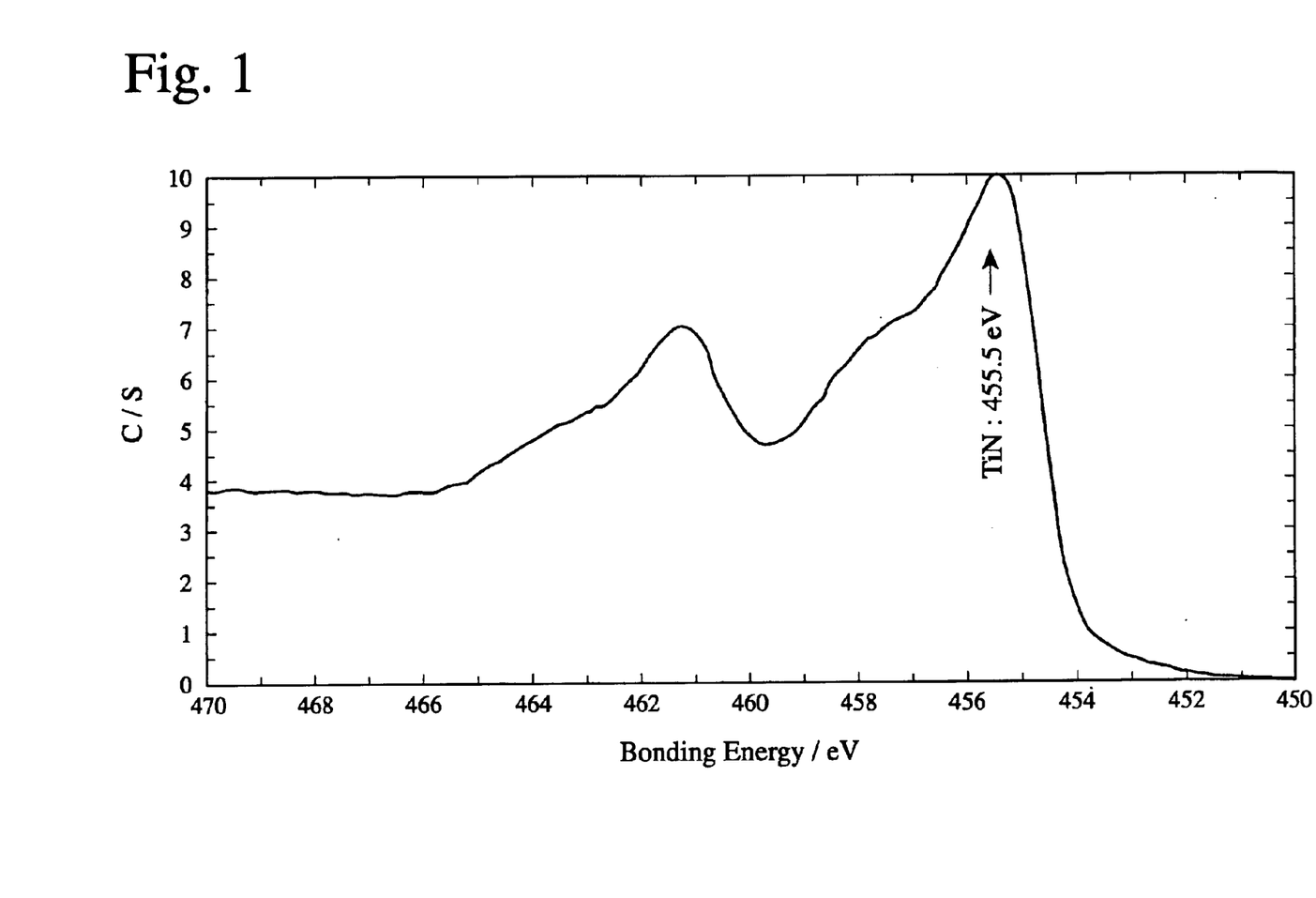
FIG. 1 is a graph showing a diffraction peak of the bonding energy of Ti and N in ESCA in the (TiB)N layer of the present invention.
Figure 2:
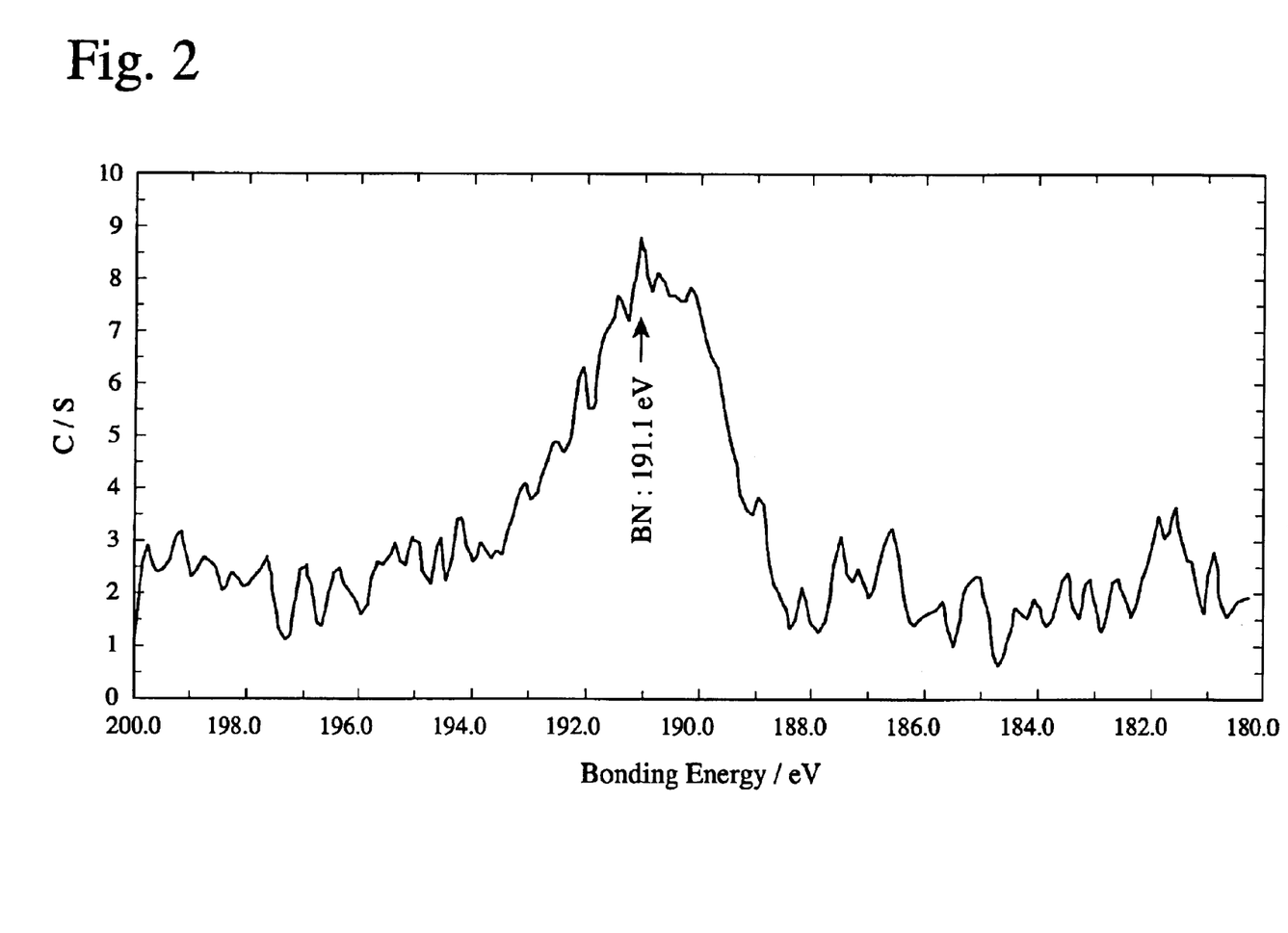
FIG. 2 is a graph showing a diffraction peak of the bonding energy of B and N in ESCA in the hard coating layer of the present invention.

Using a TiB target in a vacuum film-forming apparatus, a $(Ti_{75}B_{25})N$ layer was formed as a hard coating layer on a surface of a cemented carbide substrate by an arc-ion plating method. The film-forming conditions were a bias voltage of −300 V, a nitrogen gas flow rate of 500 sccm (standard cubic centimeter) as a reaction gas, and a reaction gas pressure of 0.5 Pa. The results of ESCA (electron spectroscopy for chemical analysis) of the resultant hard coating layer are shown in FIGS. 1 and 2. A diffraction peak of the bonding energy of Ti and N was observed in FIG. 1, and a diffraction peak of the bonding energy of B and N was observed in FIG. 2.

Figure 3:
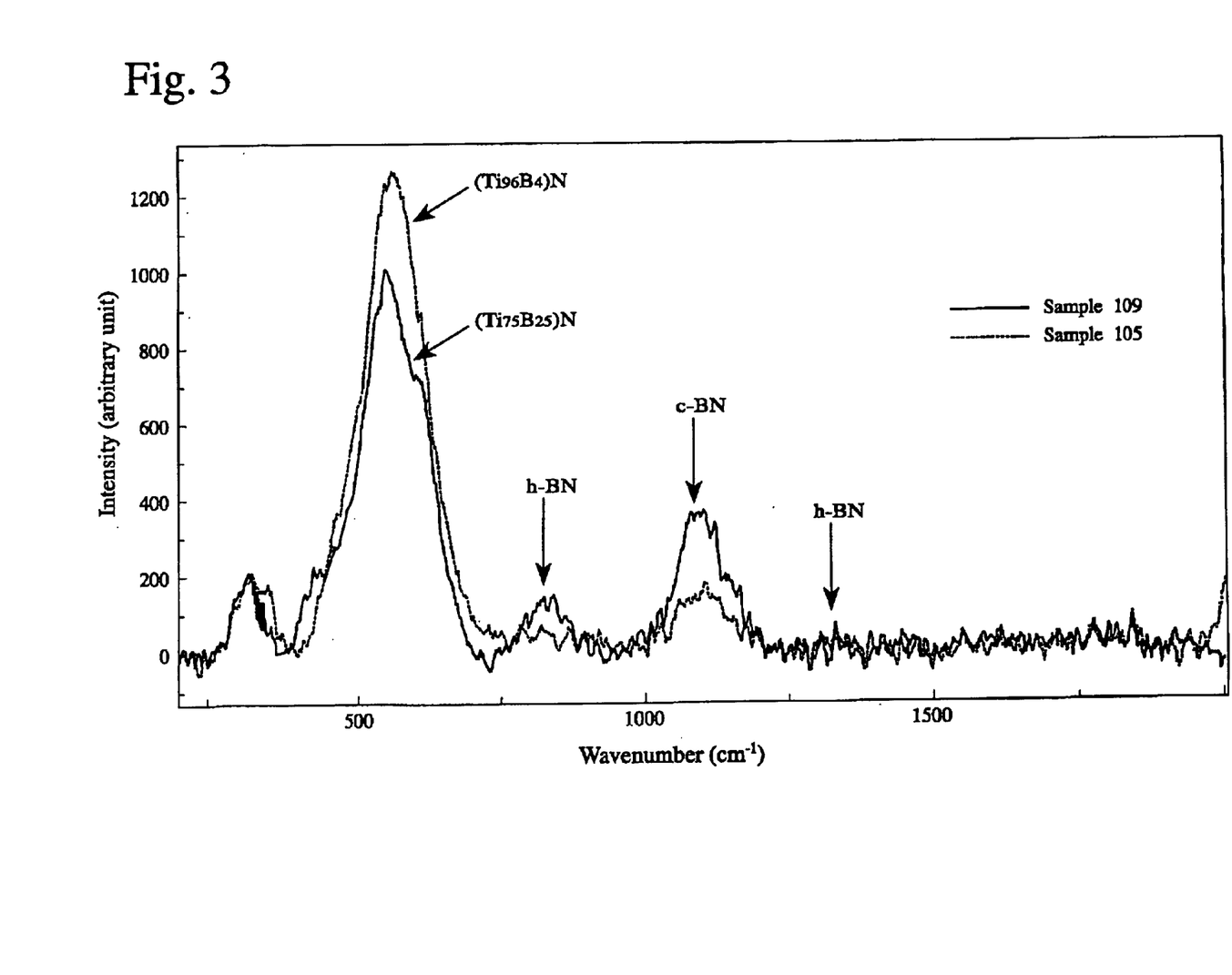
FIG. 3 is a graph showing diffraction peaks of c-BN and h-BN in a Raman spectroscopy of the hard coating layer of the present invention.

Further, (TiB)N layers were formed under the same conditions as described above, except that a pulse bias voltage of −300 V/+20 V was applied to a substrate. The Raman spectroscopic analysis results of the resultant hard coating layers are shown in FIG. 3. The existence of a c-BN phase and an h-BN phase was confirmed in FIG. 3. The ratio of each phase can be controlled by a bias voltage level.

When ion energy was high at the time of forming a hard coating layer, the ratio of c-BN was high, resulting in a hard coating layer with high hardness. When the ion energy was small, the existence of a BN phase was not observed. Even when a pulse bias was not used, the existence of a c-BN phase and an h-BN phase was observed as long as a high bias voltage was applied to a substrate. These phases are dispersed as fine crystals in the layer. Accordingly, it is important to optimize the coating conditions to achieve high hardness by dispersing fine crystals in the hard coating layer.

Figure 4:
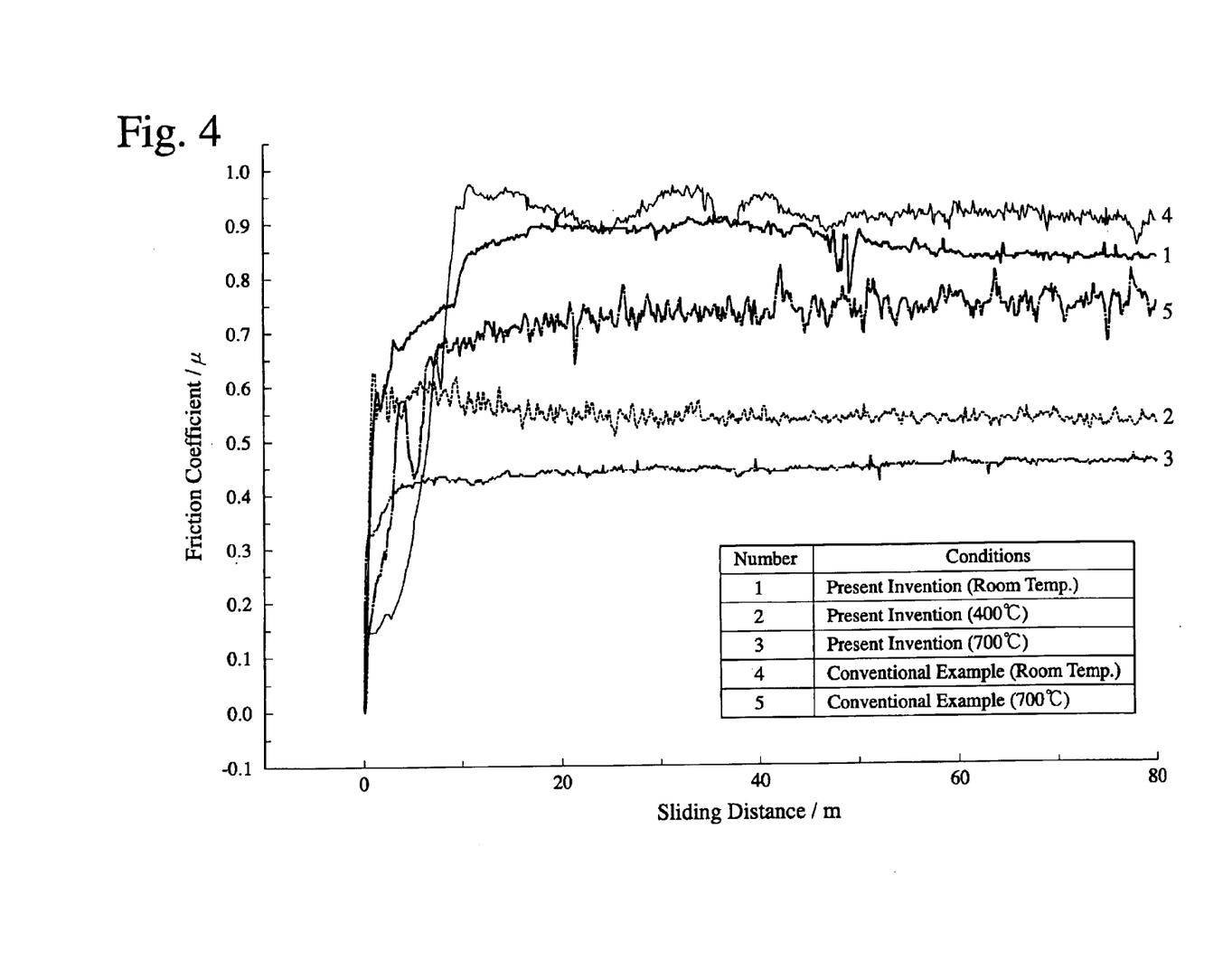
FIG. 4 is a graph showing the relation between sliding distance and friction coefficient determined by a wear test using a ball-on-disc wear measuring machine.

Using a ball-on-disc wear measuring apparatus, the hard coating layer of the present invention was measured with respect to a friction coefficient to steel. Main measurement parameters are a vertical load, a contact area, a sliding speed and test time. There is an extremely large influence of a test temperature on a friction coefficient. The temperature elevation of the hard coating layer is predominantly due to a friction heat. The chemical reaction of the hard coating layer with steel is likely to be activated by the temperature elevation. The hard coating layer of the present invention was measured with respect to a friction coefficient between room temperature and 700° C. as a temperature range in the vicinity of a cutting edge when it was formed on a cutting tool. The hard coating layer $[(Ti_{99}B_1)N_{90}O_{10}]$ of the present invention was formed on a cemented carbide disc with a ball of SKD 61 of JIS as a static member facing the disc. The measurement conditions of a friction coefficient are as follows:

| | |
|---|---|
| Contact surface pressure: | 2N, |
| Sliding speed: | 100 mm/sec, and |
| Test temperature: | room temperature (25° C.), 400° C. and 700° C. |

The relations between a friction coefficient and a sliding distance are shown in FIG. 4. For comparison, a cemented carbide disc of Conventional Example coated with a (TiAl)N layer as a hard coating layer was also measured with respect to a friction coefficient. The results are shown in FIG. 4. As is clear from FIG. 4, the hard coating layer of the present invention had a friction coefficient in a range of 0.85 to 0.95 at room temperature, which was not so different from that of the (TiAl)N layer. When the test temperature was elevated to 400° C., the friction coefficient of the hard coating layer of the present invention decreased to 0.55 to 0.6. It further decreased to 0.43 to 0.47 when the test temperature was elevated to 700° C. On the other hand, the friction coefficient of the (TiAl)N layer of Conventional Example was 0.75 to 0.85 at 700° C. This proves that the hard coating layer of the present invention had a remarkably decreased friction coefficient than the hard coating layer of Conventional Example at 700° C. corresponding to an edge temperature at the time of cutting operation, resulting in the reduction of sliding wear by chip, and that chip can thus be discharged smoothly.

As a result of investigation of a phenomenon occurring during a cutting operation, it has been found that a BO phase is formed by oxidation on a surface of a hard coating layer containing B, thereby further increasing lubrication. Because there is the lubrication of a BO phase in addition to that of a BN phase in the hard coating layer, remarkable decrease in a cutting resistance has been achieved. This phenomenon is not limited to TiN as a layer composition to which B is added, but observed in (TiAl)N, too.

Because the addition of oxygen to the hard coating layer of the present invention makes crystal grain boundaries denser, resulting in decrease in defects in the crystal grain boundaries, and thus improvement in the oxidation resistance of the hard coating layer. This seems to be because the densification of the crystal grain boundaries suppresses the diffusion of oxygen, due to the fact that the oxidation of the hard coating layer proceeds predominantly by the diffusion of oxygen in the crystal grain boundaries.

Because compounds of Ti or B and N and/or O as a non-metal, for instance, a TiB phase, a TiN phase, a BN phase, a BO phase, etc. are formed in addition to compounds of Ti and B in the hard coating layer of the present invention, the hard coating layer of the present invention had high hardness and lubricating properties. The hard coating layer of the present invention has higher hardness particularly by a TiB phase than that of TiN (HV 2200).

By further adding carbon to a TiN layer containing B as coating conditions of the hard coating layer of the present invention, the lubricating function of carbon is added, resulting in improvement in both hardness and lubricating properties.

As a result of detailed investigation of a phenomenon occurring when a hard coating layer containing B is applied to a cutting tool, it has been found that the hardness, lubricating properties and oxidation resistance of the hard coating layer is improved by B, and that B does not substantially diffuse into a work because B has low affinity for Fe contained in the work.

The hard coating layer of the present invention made of any of nitrides, carbonitrides, oxynitrides and oxycarbonitrides each containing Ti and B as metal elements is substantially comparable in oxidation resistance to conventional nitrides of Ti and Al, but the former is superior to the latter in the prevention of the seizure of part of steel in a work to an edge tip portion of a tool at high temperatures. This reason is that the hard coating layer of the present invention containing B having low wettability with Fe contained in steel can effectively prevent the seizure of a work at high temperatures. When Al, which may be a cause of seizure, is not contained in a hard coating layer, the hard coating layer shows high seizure resistance.

Figure 5:
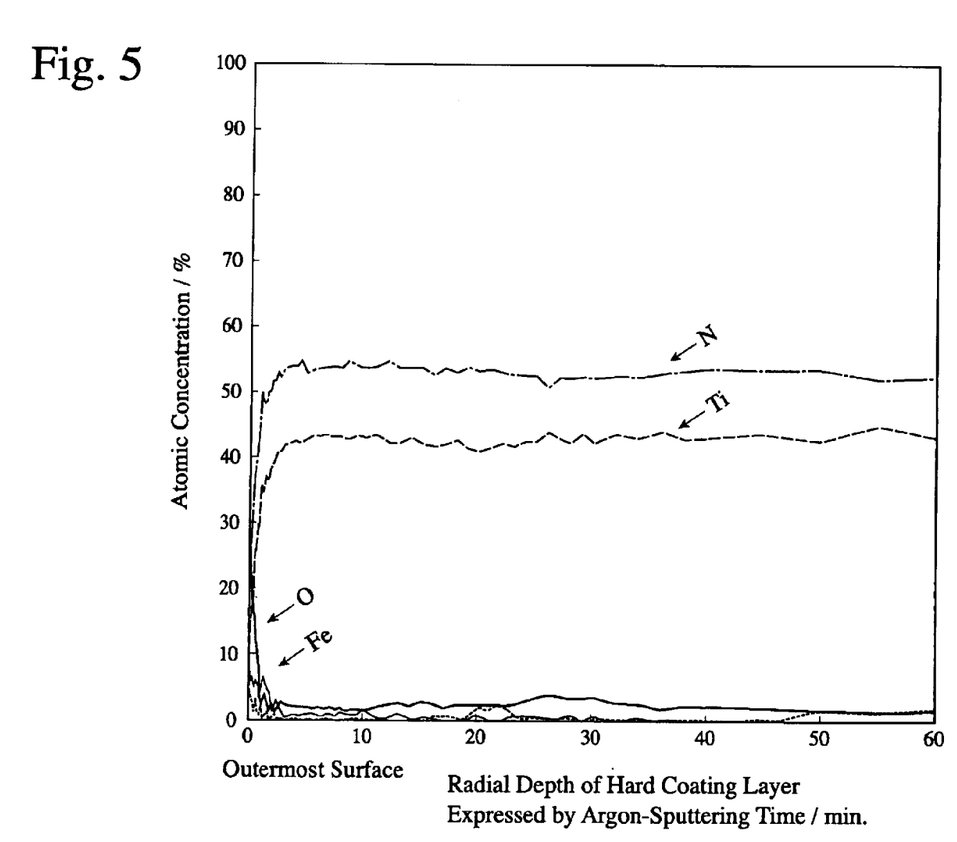
FIG. 5 is a graph showing element analysis results in the vicinity of an edge tip of the hard layer-coated tool of the present invention after cutting.
Figure 6:
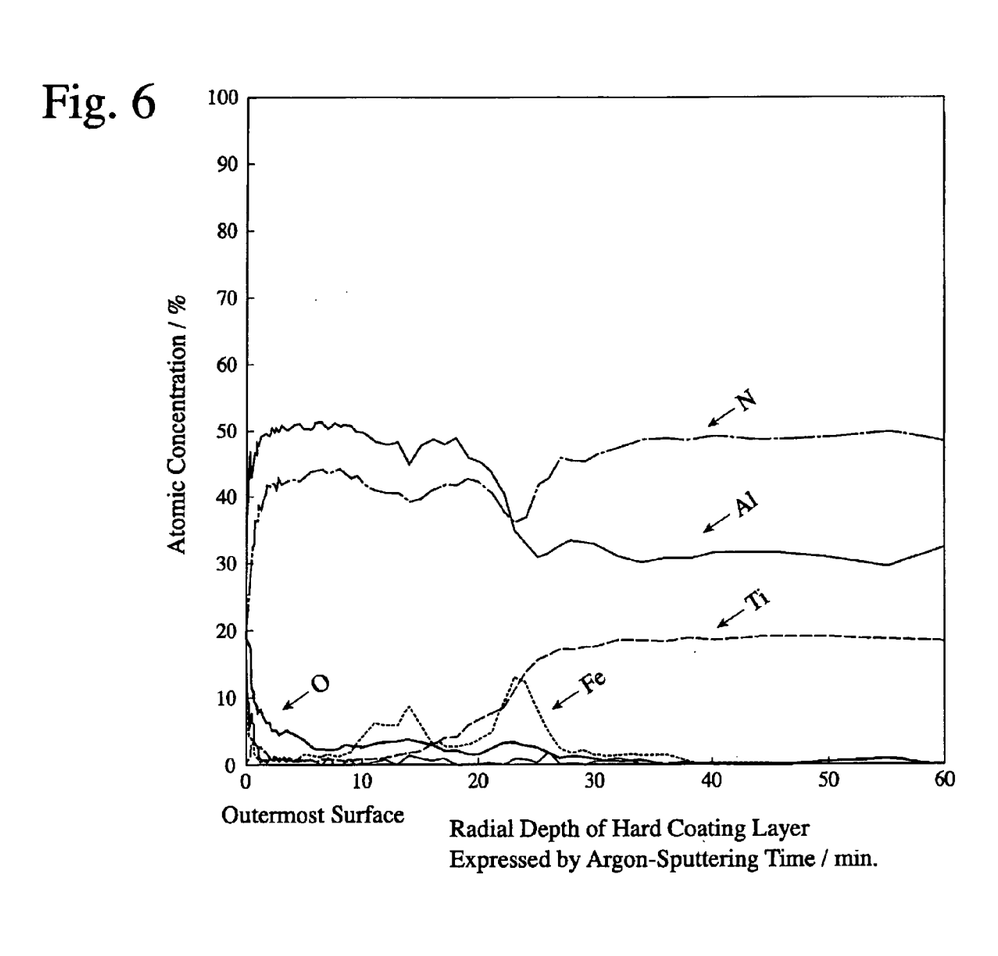
FIG. 6 is a graph showing element analysis results in the vicinity of an edge tip of a conventional hard layer-coated tool after cutting.

FIG. 5 shows the results of element analysis conducted in the vicinity of a cutting edge in a direction perpendicular to a tool substrate after a tool provided with the hard coating layer of the present invention containing a BN phase was used for a cutting operation. FIG. 6 similarly shows the results of element analysis of a conventional (TiAl)N. An Fe element derived from the work was not detected in the hard coating layer in FIG. 5, while aluminum oxide was formed in the outermost layer of the conventional (TiAl)N layer, and Fe was diffused from the work to the layer in FIG. 6. The tendency shown in FIG. 6 is also appreciated in conventional (TiAlSi)(CN) layers, (TiAlZrB)N layers, (TiAlB)N layers, etc. This proves that a chemical reaction with a work does not easily occur in the hard coating layer of the present invention having a BN phase at high temperatures. With respect to oxidation resistance, too, it has been found that the hard coating layer of the present invention is substantially comparable to conventional nitride layers of Ti and Al.

As a result of the evaluation of a conventional hard coating layer of (TiAl)N, to which B was added, with respect to seizure resistance, it has been found that because Al has higher affinity for Fe than Ti and B at high temperatures, a chemical reaction with Fe in a work occurs before an $Al_2O_3$ layer preventing the diffusion of oxygen is formed on the outermost layer of a hard coating layer containing Al. When a hard coating layer containing Al is formed on a cutting tool, a cutting tool suffers from chipping, because irregular crater wear occurs on a tool face due to a seizure phenomenon by Al, and because a large amount of a seized matter is accumulated in grain boundaries. Accordingly, to prevent the seizure of a work to a tool, it is necessary to form a hard coating layer having self-lubricating properties on a tool surface. Namely, it is possible to prevent the seizure of a work to a cutting tool surface and the irregular wear of a cutting tool by forming the hard coating layer of the present invention on the cutting tool surface. Thus, a tool provided with the hard coating layer of the present invention on the outermost surface has remarkably longer life than conventional hard layer-coated tools having coatings of nitrides of Ti and Al, etc.

As described above, by adding B and optimizing the coating conditions, the crater wear resistance of TiN can remarkably be improved. The reasons therefor are first the improvement in hardness of a hard coating layer, second the improvement in lubricating properties of a hard coating layer, and third the improvement in seizure resistance of a hard coating layer.

With respect to the first reason, because an extremely fine high-hardness BN phase is dispersed in a TiN layer, the Vickers hardness of the TiN layer remarkably increases, for instance, from 2200 to 2800. Drastic increase in hardness of the TiN layer is due to lattice strain caused by extremely fine BN crystals dispersed therein.

With respect to the second reason, the lubricating properties of the hard coating layer is improved by the BN phase having excellent lubricating properties. For instance, the friction coefficient of (TiB)N is about 0.8 at room temperature, but it drastically decreases to about 0.4 at 700° C., a cutting temperature.

With respect to the third reason, a BN phase in the hard coating layer of the present invention has low affinity for Fe contained in a work, and elements contained in the work does not substantially diffuse to the hard coating layer, resulting in decrease in the seizure of a work to an edge tip of a tool.

Because the efficiency of cutting operation is increasing year after year, cutting conditions are becoming increasingly severe. To meet the increasingly severe cutting conditions, investigation has been conducted with respect to a thickness distribution of a hard coating layer formed on a cutting tool, influence of various elements on the seizure resistance and wear resistance of a hard coating layer and the adhesion of a hard coating layer to a tool substrate, and the layer structure of a hard coating layer. As a result, it has been found that by forming a hard coating layer on a tool substrate surface, such that a half-value width Z of a (200) face in the X-ray diffraction of a hard coating layer having a BN phase is in a range of 0.3° to 0.6°, that peaks of c-BN and h-BN are detected in the Raman spectroscopy of a hard coating layer, that a ratio $Q_1/Q_2$ of a peak intensity $Q_1$ of c-BN to a peak intensity $Q_2$ of h-BN is 1.0 or more, and that a ratio K/L of the thickness K of a face to the thickness L of a flank in a cutting tool is 1.0 or more, the resultant hard layer-coated tool can exhibit excellent cutting performance with crater wear remarkably suppressed, when used for dry high-speed cutting and high-feed working.

A half-value width in an X-ray diffraction pattern of the hard coating layer of the present invention containing a BN phase is important. To obtain high adhesion of the hard coating layer to a substrate, a residual compression stress peculiar to a physical vapor deposition (PVD) method should be reduced. The half-value width in an X-ray diffraction pattern indicates the crystallinity of the hard coating layer; the larger the half-value width, the finer the crystal structure of the hard coating layer and thus the higher the internal stress. Accordingly, to control the residual internal stress, it is necessary to set the half-value width in an X-ray diffraction pattern of the hard coating layer at an optimum value.

When the half-value width exceeds 0.6°, the crystal structure of the hard coating layer becomes finer, resulting in increase in a residual stress hindering the adhesion to a substrate. Thus, when the hard layer-coated tool is subjected to large shock during a cutting operation, the hard coating layer easily peels off. Also, because a fine crystal structure contains many grain boundaries, the diffusion of oxygen from outside and the diffusion of elements of a work into the hard coating layer during cutting operation are accelerated. Therefore, the half-value width in an X-ray diffraction pattern of the hard coating layer is limited to 0.6° or less. Incidentally, the lower limit of the half-value width in an X-ray diffraction pattern of the hard coating layer is 0.3°, because it is extremely difficult to measure a half-value width of less than 0.3°. After a layer of TiAl nitride, etc. are formed on a substrate, the hard coating layers having a BN phase and TiAl nitride layers, etc. may be alternately laminated to a multi-layer structure to obtain the same effects.

The peaks of c-BN and h-BN can be detected in a Raman spectroscopy of the hard coating layer having a BN phase, and it is preferable that a ratio $Q_1/Q_2$ of a peak intensity $Q_1$ of c-BN to a peak intensity $Q_2$ of h-BN is 1.0 or more, to increase the hardness of the hard coating layer while maintaining its lubricating properties. As shown in FIG. 3, the peaks of c-BN and h-BN are detected in the hard coating layer of the present invention containing a BN phase. Comparing c-BN and h-BN with respect to hardness, the c-BN is higher. Accordingly, by controlling the coating conditions such that the resultant hard coating layer contains a large amount of c-BN, it is possible to obtain the hard coating layer having improved hardness and wear resistance.

In a conventional hard layer-coated tool, particularly in a conventional hard layer-coated throwaway insert, damage occurs mainly by a flank wear. Accordingly, a hard coating layer is conventionally formed such that it is thicker on an insert flank than on an insert face to prevent the flank wear. However, the damage of a hard layer-coated insert occurs by crater wear rather than by flank wear in recent high-feed working. Accordingly, to become suitable for high-feed working, the hard coating layer is formed such that it is thick on an insert face at which damage mostly occurs, whereby the resultant hard layer-coated insert has a long life. For this reason, the hard coating layer is formed such that a ratio K/L of the thickness K on a tool face to the thickness L on a tool flank is 1.0 or more.

The hard coating layer of the present invention is formed by using a TiB alloy target. The content of B in the hard coating layer is preferably 0.1 to 50 atomic %, based on metal elements. When the content of B is less than 0.1 atomic %, it is impossible to prevent seizure and element diffusion sufficiently. Accordingly, the content of B is set at a level of 0.1 atomic % or more, from which remarkable effects start to appear. The hard coating layer of the present invention containing Ti and B has columnar crystals, which are often observed in TiN, etc., and when the content of B exceeds 50 atomic %, the columnar crystals are changed to fine crystal particles, resulting in increase in internal defects and decrease in density. In addition, internal stress hindering layer adhesion becomes extremely large, so that the hard coating layer easily peels from a tool substrate. Further, when the hard coating layer has fine crystals, breakage is likely to occur in grain boundaries during a cutting operation, resulting in irregular wear.

A PVD method is preferable to form the hard coating layer of the present invention. Though two types of targets each comprising Ti or B may be used as a target, it is preferable to use a target made of a TiB alloy to achieve the uniformity of a hard coating layer composition and discharge stability.

The hard coating layer of the present invention is characterized by the form of B. Conventional hard coating layers made of nitrides of Ti and Al, etc. generally have a NaCltype crystal lattice structure like TiN, and Ti in a TiN lattice is replaced by Al; namely Al is dissolved in a solid solution. However, the hard coating layer of the present invention containing Ti and B may have different structures depending on the content of B. Namely, when the content of B is less than 0.1 atomic %, B is completely taken in a TiN crystal lattice (dissolved in a solid solution). On the other hand, when the content of B is 0.1 atomic % or more, B replaces for Ti in the TiN lattice and forms a compound of B dispersed in a solid solution. Accordingly, in the case of a hard coating layer made of a nitride containing Ti and B, when the content of B is 0.1 atomic % or more, there are a TiN phase and a BN phase in the hard coating layer. The structure change of the hard coating layer has large influence on the cutting performance of the hard layer-coated tool.

In the hard coating layer of the present invention comprising a TiN phase and a BN phase having excellent self lubrication and low wettability with Fe, crater wear caused by a chemical reaction can be remarkably suppressed by the existence of the BN phase. In addition, because the BN phase has excellent oxidation resistance, the hard coating layer containing a BN phase is not deteriorated at high temperatures. However, when the content of B exceeds 50 atomic %, the internal stress of the hard coating layer becomes extremely large, so that it is difficult to maintain good adhesion to a tool substrate. Namely, when the hard coating layer is subjected to shock during a cutting operation, the hard coating layer cannot withstand its own internal stress, resulting in easily peeling from a tool substrate. Accordingly, to obtain a cutting tool with targeted properties, it is preferable that the content of B in the hard coating layer does not exceed 50 atomic %.

In addition to the hard coating layer of the present invention comprising a BN phase, the hard layer-coated tool preferably comprises a second hard coating layer containing at least one metal element selected from the group consisting of Ti, Al and Cr, and at least one non-metal element selected from the group consisting of C, O and N, to improve the adhesion of the hard coating layer to a substrate. Though the hard coating layer having a BN phase has excellent seizure resistance under static and kinetic conditions, it also has a large residual compression stress. Accordingly, to compensate decrease in the adhesion to a substrate, it is preferable to provide the hard layer-coated tool with a layer for improving the adhesion to a substrate. For this purpose, it is preferable to form the second hard coating layer before forming the hard coating layer of the present invention on a tool substrate surface, to provide a well-balanced combination of the adhesion to a substrate, wear resistance, oxidation resistance, etc. to the tool.

The second reason is to improve the oxidation resistance of a layer. The hard coating layer is subjected to not only crater wear but also oxidation wear in high-speed cutting and dry cutting. When exceeding 450° C., TiN is oxidized and turned to powdery TiO. In (TiB)N comprising B, oxidation starts at about 550° C. In (TiB)(ON) further comprising O, the oxidation initiation temperature is elevated to about 700° C. Accordingly, the (TiB)(ON) layer comprising B and O exhibits its effects sufficiently up to about 700° C., though further elevation of a cutting temperature is likely to result in tool boundary wear accompanied by oxidation wear. To suppress this phenomenon, the hard coating layer of the present invention is preferably laminated with a hard coating layer of (TiAl)N or (CrAl)N having excellent oxidation resistance, to have a multi-layer structure. Oxidation is suppressed by a hard coating layer of (TiAl)N at a temperature up to 850° C., and oxidation does not occur by a hard coating layer of (CrAl)N at a temperature up to 1000° C. Thus, when the cutting temperature is elevated remarkably, these layers contribute to increase in the life of a tool in combination with the hard coating layer of the present invention.

The role of Al in the second hard coating layer of (TiAl)N is to improve wear resistance and oxidation resistance. Accordingly, to obtain a well-balanced combination of adhesion, wear resistance and oxidation resistance, the content of Al in the hard coating layer of (TiAl)N is preferably 30 to 75 atomic %, based on the total amount (100 atomic %) of metal elements. When the content of Al in the hard coating layer of (TiAl)N is 30 atomic % or more, the oxidation resistance is remarkably improved. Incidentally, when the content of Al exceeds 75 atomic %, the layer hardness remarkably decreases, resulting in the deterioration of wear resistance.

Part of Al in the hard coating layer of (TiAl)N is preferably replaced by at least one of third component selected from the group consisting of metals in Groups 4a, 5a and 6a and Si. The third component not only contributes to the solid solution strengthening of a (TiAl)N layer but also improves oxidation resistance, thereby improving tool performance.

In the case of an insert made of cemented carbide or cermet, for instance, the total thickness of the hard coating layer is preferably 3 to 15 $\mu$m on a tool face.

The hard layer-coated tool of the present invention is not only suitable for high-speed, high-feed milling operation, but also usable for turning operation because of drastically improved crater wear resistance. A lathe tool is conventionally provided with a hard coating layer of about 10 $\mu$m in thickness having an aluminum oxide layer on a surface by a chemical vapor deposition (CVD) method. Because lathing is carried out relatively continuously, the tool life is most determined by crater wear. With a hard coating layer as thick as 3 $\mu$m or more, a tool can have crater wear resistance comparable to that of a CVD layer on a face at which crater wear occurs. Further, with respect to the damage resistance of a tool provided with the hard coating layer of the present invention, cracking is unlikely to occur because a compression stress remains due to the fact that the hard coating layer is formed by a PVD method. Therefore, the hard coating layer of the present invention has excellent damage resistance, which is 10 times or more that of a CVD-coated tool whose layer has a residual tensile stress. When the thickness of the hard coating layer exceeds 15 $\mu$m, the peeling of the hard coating layer from a tool substrate is likely to occur. Accordingly, the hard coating layer of the present invention is preferably as thick as 3 to 15 $\mu$m. Incidentally, "high-feed working" is cutting whose feed per one tooth exceeds 0.3 mm/tooth.

The method for forming the hard coating layer of the present invention is not particularly restrictive but preferably a PVD method in which bias voltage is applied to a substrate, such as an arc-discharge ion plating method or a sputtering method, which can form a hard coating layer having a residual compression stress at relatively low temperatures, taking into consideration thermal influence on a substrate, fatigue intensity of a tool, adhesion to a substrate, etc.

When the second hard coating layer is laminated with the hard coating layer of the present invention, it is preferable that the hard coating layer of the present invention having excellent lubricating properties is formed on the side of a layer surface, and that the second hard coating layer having excellent oxidation resistance is formed on the side of a tool substrate. In the case of the multi-layer lamination of many hard coating layers of the present invention and many second hard coating layers, it is preferable to laminate them alternately under the condition that the hard coating layer of the present invention exists on an outermost surface. Incidentally, in the case of the multi-layer structure, the number of layers laminated is not restrictive.

The present invention will be described in detail referring to Examples below without intention of limiting the present invention thereto.

EXAMPLE 1

Using an arc-ion plating apparatus, and selecting those desired from targets of various alloys as metal element sources, and a nitrogen gas, an oxygen gas and a methane gas as reaction gases depending on the targeted compositions of hard coating layers, milling inserts (bottom-tool inserts of RDMW 1604MOTN) each made of cemented carbide (P40 grade) for cutting tools according to JIS B 4053 were provided with first and second hard coating layers having various compositions shown in Table 1. Incidentally, a TiB target used had a composition of 75 atomic % of Ti and 25 atomic % of B. In the case of multi-layer structures of three layers or more, the first layers and the second layers were alternately laminated.

In Samples of the present invention, the conditions of forming hard coating layers as the first layers were a substrate temperature of 400° C., a bias voltage of −300 V, and a reaction gas ($N_2$) pressure of 0.5 Pa to form a BN phase. Also, the conditions of forming (TiAl)N layers as the second layers were a substrate temperature of 400° C., a reaction gas ($N_2$) pressure of 1.0 Pa, and a bias voltage of −150 V applied to a substrate. In Comparative Examples, other layers than (TiAl)N layers were formed under the same conditions as in (TiAl)N layers.

The composition and layer structure of each hard coating layer are shown in Table 1. The compositions of Ti and B in the first layer are determined by the target composition, and a ratio of N to (TiB) is determined by the reaction gas ($N_2$) pressure. In addition, the overlapping peaks of Ti and N are difficult to separate. Therefore, the atomic % of Ti and B and ratios of metal elements non-metal elements in the first layers are omitted in Table 1. The thickness shown in Table 1 was the thickness of each hard coating layer on a tool face.

Using the resultant hard layer-coated inserts, a work of SKD61 (hardness HRC 45) was face-milled in a width of 100 mm and a length of 250 mm by dry cutting under the conditions of a cutting depth of 1.0 mm, a cutting speed of 200 m/min, and a feed of 1.5 mm/tooth. In the case of milling in which a feed per one tooth exceeds 1 mm, a cutting temperature tends to locally increase, resulting in crater wear. Because a tool life is predominantly determined by the crater wear under the present cutting conditions, a time period until a tool became unable to cut by the crater wear was defined as "cutting time until damage occurred." The cutting time until damage occurred is shown in Table 1.

TABLE 1

| Sample No. | Composition (atomic %) | | Thickness[3] (μm) | Number of Layers[4] | Cutting Time Until Damage Occurred (min.) |
|---|---|---|---|---|---|
| | First Layer[1] | Second Layer[2] | | | |
| 1 | (TiB)N | $(Ti_{50}Al_{50})N$ | 3 | 2 | 55 |
| 2 | (TiB)N | $(Ti_{50}Al_{50})N$ | 6 | 2 | 126 |
| 3 | (TiB)N | $(Ti_{50}Al_{50})N$ | 10 | 2 | 240 |
| 4 | (TiB)N | $(Ti_{50}Al_{50})N$ | 6 | 8 | 147 |
| 5 | (TiB)N | $(Ti_{50}Al_{50})N$ | 6 | 20 | 165 |
| 6 | (TiB)N | $(Ti_{50}Al_{50})N$ | 6 | 40 | 155 |
| 7 | (TiB)N | $(Ti_{40}Al_{60})N$ | 6 | 2 | 142 |
| 8 | $(TiB)N_{95}O_5$ | $(Ti_{50}Al_{50})N$ | 6 | 2 | 137 |
| 9 | $(TiB)N_{95}C_5$ | $(Ti_{50}Al_{50})N$ | 6 | 2 | 158 |
| 10 | (TiB)N | $(Ti_{50}Al_{50})N_{95}O_5$ | 6 | 2 | 130 |
| 11 | (TiB)N | $(Ti_{50}Al_{50})N_{95}C_5$ | 6 | 2 | 124 |
| 12 | $(TiB)N_{95}O_5$ | $(Ti_{50}Al_{50})N_{95}O_5$ | 6 | 2 | 130 |
| 13 | (TiB)N | $(Ti_{50}Al_{50})N$ | 15 | 40 | 268 |
| 14 | (TiB)N | $(Ti_{50}Al_{50})N$ | 15 | 100 | 286 |
| 15* | — | TiN | 6 | 1 | 17 |
| 16* | — | TiCN | 6 | 1 | 20 |
| 17* | — | $(Ti_{50}Al_{50})N$ | 6 | 1 | 35 |
| 18* | $(Ti_{50}Al_{50})N$ | TiN | 6 | 2 | 25 |
| 19* | — | (TiZr)N | 6 | 1 | 20 |

Note
*Comparative Examples.
[1]Atomic % of Ti and B and a ratio of metal element/non-metal element are omitted.
[2]Layer formed directly on a surface of the insert substrate.
[3]Thickness on the face.
[4]When there were three or more layers, the first layers and the second layers were laminated alternately.

As is clear from Table 1, the tool life was remarkably increased in Samples of the present invention, while Samples of Comparative Examples had short life by the crater wear. This proved that the hard coating layer of the present invention remarkably improved the crater wear resistance of the tool.

EXAMPLE 2

Using the same targets and conditions as in Example 1, cermet inserts (TNGG 110302R) for turning operation were coated with layers having compositions shown in Table 2. Using the resultant hard layer-coated cermet inserts, works of S53C were cut while turning under the conditions of a cutting speed of 220 m/minute, a cutting depth of 1 mm and a feed of 0.15 mm/rev. with a cutting oil. The cermet composition of each insert was 60TiCN—10WC—10TaC—5$Mo_2$C—5Ni—10Co by weight %.

Flank wear tends to increase by heat generation by the crater wear in any hard layer-coated cermet inserts. Thus, the life of the tool was determined at a time when the flank wear reached 0.1 mm. The cutting time until reaching life is shown in Table 2.

TABLE 2

| Sample No. | Composition (atomic %) First Layer[1] | Composition (atomic %) Second Layer[2] | Thickness[3] (μm) | Number of Layers[4] | Cutting Time Until Reaching Life (min.) |
|---|---|---|---|---|---|
| 20 | (TiB)N | (Ti$_{50}$Al$_{50}$)N | 3 | 2 | 43 |
| 21 | (TiB)N | (Ti$_{50}$Al$_{50}$)N | 6 | 2 | 101 |
| 22 | (TiB)N | (Ti$_{50}$Al$_{50}$)N | 10 | 2 | 154 |
| 23 | (TiB)N | (Ti$_{50}$Al$_{50}$)N | 6 | 8 | 111 |
| 24 | (TiB)N | (Ti$_{50}$Al$_{50}$)N | 6 | 20 | 123 |
| 25 | (TiB)N | (Ti$_{50}$Al$_{50}$)N | 6 | 40 | 131 |
| 26 | (TiB)N | (Ti$_{40}$Al$_{60}$)N | 6 | 2 | 122 |
| 27 | (TiB)N$_{95}$O$_5$ | (Ti$_{50}$Al$_{50}$)N | 6 | 2 | 98 |
| 28 | (TiB)N$_{95}$C$_5$ | (Ti$_{50}$Al$_{50}$)N | 6 | 2 | 126 |
| 29 | (TiB)N | (Ti$_{50}$Al$_{50}$)N$_{95}$O$_5$ | 6 | 2 | 131 |
| 30 | (TiB)N | (Ti$_{50}$Al$_{50}$)N$_{95}$C$_5$ | 6 | 2 | 113 |
| 31 | (TiB)N$_{95}$O$_5$ | (Ti$_{50}$Al$_{50}$)N$_{95}$O$_5$ | 6 | 2 | 101 |
| 32 | (TiB)N | (Ti$_{50}$Al$_{50}$)N | 15 | 40 | 211 |
| 33 | (TiB)N | (Ti$_{50}$Al$_{50}$)N | 15 | 100 | 221 |
| 34* | — | TiN | 6 | 1 | 12 |
| 35* | — | TiCN | 6 | 1 | 16 |
| 36* | — | (Ti$_{50}$Al$_{50}$)N | 6 | 1 | 29 |
| 37* | (Ti$_{50}$Al$_{50}$)N | TiN | 6 | 2 | 18 |
| 38* | — | (Ti Zr)N | 6 | 1 | 11 |

Note
*Comparative Examples.
[1]Atomic % of Ti and B and a ratio of metal element/non-metal element are omitted.
[2]Layer formed directly on a surface of the insert substrate.
[3]Thickness on the face.
[4]When there were three or more layers, the first layers and the second layers were laminated alternately.

EXAMPLE 3

Samples 39–52 of the present invention and Samples 15–19 of Comparative Examples were produced under the same conditions as in Example 1, except that part of Al in Ti—Al alloy targets for the second layers was replaced by other elements shown in Table 3, and evaluated with respect to cutting performance. The results are shown in Table 3.

As is clear from Table 3, the tool life was further improved by adding a third component to a hard TiAl coating layer as the second layer. This is because the solid solution strengthening of a (TiAl)N layer occurred by the addition of a third component, resulting in improvement in oxidation resistance.

TABLE 3

| Sample No. | Composition (atomic %) First Layer[1] | Composition (atomic %) Second Layer[2] | Thickness[3] (μm) | Number of Layers[4] | Cutting Time Until Damage Occurred (min.) |
|---|---|---|---|---|---|
| 39 | (TiB)N | (Ti$_{50}$Al$_{45}$Zr$_5$)N | 6 | 2 | 136 |
| 40 | (TiB)N | (Ti$_{50}$Al$_{45}$Cr$_5$)N | 6 | 2 | 142 |
| 41 | (TiB)N | (Ti$_{50}$Al$_{45}$Hf$_5$)N | 6 | 2 | 152 |
| 42 | (TiB)N | (Ti$_{50}$Al$_{45}$V$_5$)N | 6 | 2 | 133 |
| 43 | (TiB)N | (Ti$_{50}$Al$_{45}$Nb$_5$)N | 6 | 2 | 141 |
| 44 | (TiB)N | (Ti$_{50}$Al$_{45}$Mo$_5$)N | 6 | 2 | 140 |
| 45 | (TiB)N | (Ti$_{50}$Al$_{45}$Si$_5$)N | 6 | 2 | 182 |
| 46 | (TiB)N$_{95}$O$_5$ | (Ti$_{50}$Al$_{45}$Zr$_5$)N | 6 | 2 | 142 |
| 47 | (TiB)N$_{95}$C$_5$ | (Ti$_{50}$Al$_{45}$Zr$_5$)N | 6 | 2 | 168 |
| 48 | (TiB)N | (Ti$_{50}$Al$_{45}$Zr$_5$)N$_{95}$O$_5$ | 6 | 2 | 138 |
| 49 | (TiB)N | (Ti$_{50}$Al$_{45}$Si$_5$)N$_{95}$C$_5$ | 6 | 2 | 192 |
| 50 | (TiB)N$_{95}$O$_5$ | (Ti$_{50}$Al$_{45}$Cr$_5$)N$_{95}$O$_5$ | 6 | 2 | 150 |
| 51 | (TiB)N | (Ti$_{50}$Al$_{45}$Si$_5$)N | 15 | 40 | 301 |
| 52 | (TiB)N | (Ti$_{50}$Al$_{45}$Si$_5$)N | 15 | 100 | 321 |
| 15* | — | TiN | 6 | 1 | 17 |
| 16* | — | TiCN | 6 | 1 | 20 |
| 17* | — | (Ti$_{50}$Al$_{50}$)N | 6 | 1 | 35 |
| 18* | (Ti$_{50}$Al$_{50}$)N | TiN | 6 | 2 | 25 |
| 19* | — | (Ti Zr)N | 6 | 1 | 20 |

Note
*Comparative Examples.
[1]Atomic % of Ti and B and a ratio of metal element/non-metal element are omitted.
[2]Layer formed directly on a surface of the insert substrate.
[3]Thickness on the face.
[4]When there were three or more layers, the first layers and the second layers were laminated alternately.

EXAMPLE 4

Using an arc-ion plating apparatus, and selecting those desired from targets of various alloys as metal element sources, and a nitrogen gas, an oxygen gas and a methane gas as reaction gases depending on the targeted compositions of hard coating layers, milling inserts (bottom-tool inserts of RDMW 1604MOTN) made of cemented carbide (P40 grade) for cutting tools according to JIS B 4053 were provided with various hard coating layers shown in Table 5 under the conditions shown in Table 4. Incidentally, other conditions than shown in Table 4 are the same as in Example 1. The thickness shown in Table 5 was the thickness of each hard coating layer on a face, and the first layers and the second layers were alternately laminated in the case of multi-layer structures of three layers or more. Other coating conditions than described above are the same as in Example 1.

Using the resultant hard layer-coated inserts, each work of SKD61 (hardness HRC 45) was face-milled in a width of 100 mm and a length of 250 mm by dry cutting under the conditions of a cutting depth of 1.0 mm, a cutting speed of 250 m/min, and a feed of 1.5 mm/tooth. In the milling in which a feed per one tooth exceeds 1 mm, a cutting temperature tends to increase locally, resulting in crater wear. Accordingly, cutting time until damage occurred was measured as in Example 1. Table 5 shows the layer structures and the cutting time until damage occurred in the hard coating layers of Examples and Conventional Examples.

TABLE 4

| Condition | Substrate Temperature (° C.) | Reaction Gas Pressure (Pa) | Bias Voltage Applied to Substrate (V) |
|---|---|---|---|
| A | 400 | 1.0 | −150 |
| B | 400 | 0.5 | −300/+20 (pulse) |
| C | 400 | 0.5 | −150/+20 (pulse) |
| D | 400 | 0.5 | −300 |

TABLE 5

| Sample No. | First Layer[1] Composition (atomic %) | Condition | Second Layer[2] Composition (atomic %) | Condition | Thickness[3] (μm) | Number of Layers[4] | Cutting Time Until Damage Occurred (min.) |
|---|---|---|---|---|---|---|---|
| 53 | (TiB)N | B | — | — | 3 | 1 | 124 |
| 54 | (TiB)N | C | — | — | 3 | 1 | 105 |
| 55 | (TiB)N | D | — | — | 3 | 1 | 87 |
| 56 | (TiB)N | B | $(Ti_{50}Al_{50})N$ | A | 3 | 2 | 141 |
| 57 | (TiB)N | C | $(Ti_{50}Al_{50})N$ | A | 3 | 2 | 132 |
| 58 | (TiB)N | D | $(Ti_{50}Al_{50})N$ | A | 3 | 2 | 111 |
| 59 | (TiB)ON | B | $(Ti_{50}Al_{50})N$ | A | 3 | 2 | 153 |
| 60 | (TiB)(CN) | B | $(Ti_{50}Al_{50})N$ | A | 3 | 2 | 163 |
| 61 | (TiB)N | B | $(Ti_{50}Al_{50})ON$ | A | 3 | 2 | 159 |
| 62 | (TiB)N | B | $(Ti_{50}Al_{50})(CN)$ | A | 3 | 2 | 167 |
| 63 | (TiB)N | B | $(Cr_{50}Al_{50})(CN)$ | A | 3 | 2 | 144 |
| 64 | (TiB)N | B | $(Ti_{50}Al_{50})N$ | A | 5 | 2 | 165 |
| 65 | (TiB)N | B | $(Ti_{50}Al_{50})N$ | A | 5 | 100 | 185 |
| 66 | (TiAlB)N | B | $(Ti_{50}Al_{50})N$ | A | 3 | 2 | 187 |
| 67 | (TiB)N | B | TiN | A | 3 | 2 | 95 |
| 68 | (TiCrB)N | B | $(Ti_{50}Al_{50})N$ | A | 3 | 2 | 140 |
| 69 | (TiSiB)N | B | $(Ti_{50}Al_{50})N$ | A | 3 | 2 | 198 |
| 70 | (TiZrB)N | B | $(Ti_{50}Al_{50})N$ | A | 3 | 2 | 112 |
| 71 | (TiVB)N | B | $(Ti_{50}Al_{50})N$ | A | 3 | 2 | 94 |
| 72 | (TiHfB)N | B | $(Ti_{50}Al_{50})N$ | A | 3 | 2 | 100 |
| 73** | TiN | A | — | — | 3 | 1 | 17 |
| 74** | TiN | A | $MoS_2$ | — | 3 | 2 | 26 |
| 75** | $(Ti_{50}Al_{50})N$ | A | CrN | A | 3 | 2 | 34 |
| 76** | $(Ti_{50}Al_{50})N$ | B | CrN | A | 3 | 2 | 28 |
| 77** | (TiB)N | A | — | — | 3 | 1 | 51 |
| 78** | (TiZr)N | A | — | — | 3 | 1 | 20 |

Note
**Conventional Examples.
[1]Atomic % of Ti and B and a ratio of metal element/non-metal element are omitted.
[2]Layer formed directly on a surface of the insert substrate.
[3]Thickness on the face.
[4]When there were three or more layers, the first layers and the second layers were laminated alternately.

As is clear from Table 5, remarkable improvement in life was observed in Samples of the present invention. While all Samples of Conventional Examples exhibited short life by the crater wear, Samples of the present invention exhibited improved life because of remarkable improvement in crater wear resistance.

In Samples 53–55 of the present invention, (TiB)N layers as the first layers were formed under various coating conditions. Any Samples exhibited long life, and particularly those produced under pulse bias conditions with high ion energy exhibited extremely long life.

In Samples 56–58 of the present invention, each (TiB)N layer was laminated with each (TiAl)N layer. Samples 59 of the present invention was obtained by adding oxygen to the (TiB)N layer of Sample 56. Sample 60 of the present invention was obtained by adding carbon to the (TiB)N layer of Sample 56. Improvement in cutting time until damage occurred was observed in any of Samples 59 and 60 than Sample 56.

Samples 61 and 62 of the present invention were obtained by adding oxygen or carbon to the (TiAl)N layer as the second layer. Sample 65 of the present invention was obtained by laminating a (TiB)N layer with a (TiAl)N layer, exhibiting the effects of lamination.

Sample 66 of the present invention was obtained by adding B to (TiAl)N, exhibiting the same improvement in cutting time as obtained by adding B to TiN. Samples 68–72 of the present invention were obtained by adding B to other compositions.

Though Conventional Example 76 was obtained by forming a (TiAl)N coating layer under pulse bias conditions, it failed to exhibit remarkable improvement in cutting time because of no B. Though Conventional Example 77 was obtained by adding B to TiN, it failed to exhibit remarkable improvement in cutting time because of coating conditions with small ion energy.

EXAMPLE 5

Cermet inserts (TNGG 110302R) for turning operation were provided with the hard coating layers of the present invention and those of Conventional Examples both shown in Table 5 in the same manner as in Example 4. The cermet for the inserts had a composition of 60% by weight of Ti (CN), 10% by weight of WC, 10% by weight of TaC, 5% by weight of $Mo_2C$, 5% by weight of Ni, and 10% by weight of Co. Using each of the resultant hard layer-coated cermet inserts, each work of S53C was cut by turning under the wet cutting conditions of a cutting speed of 220 m/min, a cutting depth of 1 mm, and a feed of 0.15 mm/rev. There was large heat generation by the crater wear in any Samples, resulting in increase in flank wear. The tool life was determined at a time when flank wear reached 0.1 mm. The tool cutting time until reaching life is shown in Table 6.

TABLE 6

| Sample No.[1] | First Layer[1] Composition (atomic %) | Condition | Second Layer[2] Composition (atomic %) | Condition |
|---|---|---|---|---|
| 79 | (TiB)N | B | — | — |
| 80 | (TiB)N | C | — | — |
| 81 | (TiB)N | D | — | — |
| 82 | (TiB)N | B | $(Ti_{50}Al_{50})N$ | A |
| 83 | (TiB)N | C | $(Ti_{50}Al_{50})N$ | A |
| 84 | (TiB)N | D | $(Ti_{50}Al_{50})N$ | A |
| 85 | (TiB)ON | B | $(Ti_{50}Al_{50})N$ | A |
| 86 | (TiB)(CN) | B | $(Ti_{50}Al_{50})N$ | A |
| 87 | (TiB)N | B | $(Ti_{50}Al_{50})ON$ | A |
| 88 | (TiB)N | B | $(Ti_{50}Al_{50})(CN)$ | A |
| 89 | (TiB)N | B | $(Cr_{50}Al_{50})(CN)$ | A |
| 90 | (TiB)N | B | $(Ti_{50}Al_{50})N$ | A |
| 91 | (TiB)N | B | $(Ti_{50}Al_{50})N$ | A |
| 92 | (TiAlB)N | B | $(Ti_{50}Al_{50})N$ | A |
| 93 | (TiB)N | B | TiN | A |
| 94 | (TiCrB)N | B | $(Ti_{50}Al_{50})N$ | A |
| 95 | (TiSiB)N | B | $(Ti_{50}Al_{50})N$ | A |
| 96 | (TiZrB)N | B | $(Ti_{50}Al_{50})N$ | A |
| 97 | (TiVB)N | B | $(Ti_{50}Al_{50})N$ | A |
| 98 | (TiHfB)N | B | $(Ti_{50}Al_{50})N$ | A |
| 99** | TiN | A | — | — |
| 100** | TiN | A | $MoS_2$ | — |
| 101** | $(Ti_{50}Al_{50})N$ | A | CrN | A |
| 102** | $(Ti_{50}Al_{50})N$ | B | CrN | A |
| 103** | (TiB)N | A | — | — |
| 104** | (Ti Zr)N | A | — | — |

| Sample No.[1] | Thickness[3] (µm) | Number of Layers[4] | Cutting Time Until Reaching Life (min.) |
|---|---|---|---|
| 79 | 3 | 1 | 58 |
| 80 | 3 | 1 | 45 |
| 81 | 3 | 1 | 39 |
| 82 | 3 | 2 | 67 |
| 83 | 3 | 2 | 53 |
| 84 | 3 | 2 | 44 |
| 85 | 3 | 2 | 67 |
| 86 | 3 | 2 | 75 |
| 87 | 3 | 2 | 48 |
| 88 | 3 | 2 | 51 |
| 89 | 3 | 2 | 69 |
| 90 | 5 | 2 | 85 |
| 91 | 5 | 100 | 92 |
| 92 | 3 | 2 | 53 |
| 93 | 3 | 2 | 50 |
| 94 | 3 | 2 | 52 |
| 95 | 3 | 2 | 75 |
| 96 | 3 | 2 | 48 |
| 97 | 3 | 2 | 40 |
| 98 | 3 | 2 | 46 |
| 99** | 3 | 1 | 11 |
| 100** | 3 | 2 | 13 |
| 101** | 3 | 2 | 16 |
| 102** | 3 | 2 | 13 |
| 103** | 3 | 1 | 29 |
| 104** | 3 | 1 | 10 |

Note
**Conventional Examples.
[1]Atomic % of Ti and B and a ratio of metal element / non-metal element are omitted.
[2]Layer formed directly on a surface of the insert substrate.
[3]Thickness on the face.
[4]When there were three or more layers, the first layers and the second layers were laminated alternately.

As is clear from Table 6, inserts having hard coating layers under pulse bias conditions with high ion energy exhibited the longest life in turning operation. This result coincides what obtained in Example 4.

Remarkable improvement in cutting time until reaching life was observed in Samples 79–98 of the present invention. On the other hand, flank wear rapidly increased by the crater wear in Samples 99–104 of Conventional Examples, resulting in the hard layer-coated inserts with short life. Long life in Samples 79–98 of the present invention is predominantly due to improvement in crater wear resistance.

Samples 79–81 of the present invention had (TiB)N layers as the first layers, with different conditions in coating the first layers. Any Samples had long life, and particularly those having (TiB)N layers formed under pulse bias conditions with high ion energy exhibited the longest life.

Samples 82–84 of the present invention were formed by laminating a (TiB)N layer and a (TiAl)N layer. Sample 85 of the present invention was formed by adding oxygen to the (TiB)N layer of Sample 82, and Sample 86 of the present invention was formed by adding carbon to the (TiB)N layer of Sample 82, both exhibiting cutting time until reaching life, which was equal to or longer than that of Sample 82.

Samples 87 and 88 of the present invention were formed by adding oxygen or carbon to the (TiAl)N layer as the second layer. Sample 91 of the present invention was formed by laminating (TiB)N layers with (TiAl)N layers to many layers, exhibiting the effects of lamination.

Sample 92 of the present invention was formed by adding B to the (TiAl)N layer, exhibiting the same improvement in cutting time as that obtained by adding B to TiN. Samples 94–98 of the present invention were formed by adding B to the first layers having other compositions than described above.

In Conventional Example 102, in which a (TiAl)N layer was formed under pulse bias conditions, there was no remarkable improvement in cutting time because of no B. In Conventional Example 103, in which B was added to TiN, there was no remarkable improvement in cutting time because of coating conditions with small ion energy.

EXAMPLE 6

Using an arc-ion plating apparatus, and selecting those desired from targets of various alloys as metal element sources, and an $N_2$ gas, a $CH_4$ gas and a mixture gas of Ar and an $O_2$ as reaction gases depending on the targeted compositions of hard coating layers, throwaway inserts (special shape of SDE53TN) made of cemented carbide were provided with hard coating layers shown in Table 8. The film-forming conditions were C shown in Table 4. The reaction gas pressure was shown in Table 7 below.

TABLE 7

| Type of Layer | Reaction Gas | Total Pressure of Reaction Gas (Pa) |
|---|---|---|
| Nitride | $N_2$ gas | 2.5 |
| Oxynitride | $N_2$ gas + $O_2$ gas | 2.5 |
| Carbonitride | $N_2$ gas + $CH_4$ gas | 0.8 |
| Oxycarbonitride | $N_2$ gas + $O_2$ gas + $CH_4$ gas | 1.0 |

Each of the resultant hard layer-coated inserts was mounted onto a face-milling cutter, to carry out a cutting operation to a work of S50C (HRC 30) of 100 mm in width and 250 mm in length by a center cutting method without using a cutting oil, under high-efficiency dry cutting conditions at a cutting depth of 2.0 mm, a cutting speed of 150 m/min and a feed of 1.80 mm/tooth. Cutting was conducted until the tool became unable to cut the work due to the chipping of an edge tip or the wear of the insert, etc., and cutting length until cutting became impossible was defined as "tool life." The details of the hard coating layers and tool life in Examples, Comparative Examples and Conventional Examples are shown in Table 8.

TABLE 8

First Layer

| Sample No. | Composition (atomic %) | Condition | Half-Value Width of (200) Face (°) | Raman Peak Intensity Ratio ($Q_1/Q_2$) | BN Crystals |
|---|---|---|---|---|---|
| 105 | $(Ti_{96}B_4)N$ | C | 0.306 | 5.10 | yes |
| 106 | $(Ti_{90}B_{10})N$ | C | 0.424 | 8.40 | yes |
| 107 | $(Ti_{81}B_{19})ON$ | C | 0.516 | 1.90 | yes |
| 108 | $(Ti_{99}B_1)CON$ | C | 0.588 | 2.80 | yes |
| 109 | $(Ti_{75}B_{25})N$ | C | 0.594 | 3.60 | yes |
| 110 | $(Ti_{64}B_{36})ON$ | C | 0.316 | 1.40 | yes |
| 111 | $(Ti_{60}B_{40})N$ | C | 0.464 | 2.90 | yes |
| 112 | $(Ti_{52}B_{48})N$ | C | 0.524 | 3.80 | yes |
| 113 | $(Ti_{62}B_{38})ON$ | C | 0.586 | 5.10 | yes |
| 114 | $(Ti_{80}B_{20})CN$ | C | 0.324 | 1.90 | yes |
| 115 | $(Ti_{76}B_{24})N$ | C | 0.448 | 2.20 | yes |
| 116 | $(Ti_{64}B_{36})ON$ | C | 0.528 | 5.05 | yes |
| 117 | $(Ti_{50}B_{50})N$ | C | 0.444 | 6.60 | yes |
| 118 | $(Ti_{91}B_9)CN$ | C | 0.568 | 4.80 | yes |
| 119 | $(Ti_{86}B_{14})N$ | C | 0.586 | 2.60 | yes |
| 120 | $(Ti_{75}B_{25})CN$ | C | 0.474 | 1.50 | yes |
| 121 | $(Ti_{83}B_{17})ON$ | C | 0.368 | 1.40 | yes |
| 122 | $(Ti_{88}B_{12})N$ | C | 0.336 | 3.30 | yes |
| 123 | $(Ti_{60}B_{40})ON$ | C | 0.324 | 2.70 | yes |
| 124 | $(Ti_{55}B_{45})N$ | C | 0.542 | 1.02 | yes |
| 125* | $(Ti_{99.98}B_{0.02})N$ | C | 0.386 | no | no |
| 126* | $(Ti_{45}B_{55})N$ | C | 0.424 | 0.40 | yes |
| 127* | $(Ti_{48}B_{52})N$ | C | 0.620 | 2.90 | yes |
| 128* | $(Ti_{99.95}B_{0.05})ON$ | C | 0.790 | no | no |
| 129* | $(Ti_{37}B_{63})N$ | C | 0.524 | 0.50 | yes |
| 130* | $(Ti_{27}B_{73})ON$ | C | 0.870 | 4.40 | yes |
| 131* | $(Ti_{33}B_{67})CN$ | C | 0.600 | 4.90 | yes |
| 132** | $(Ti_{76}Si_{24})N$ | A | — | — | — |
| 133** | — | — | — | — | — |
| 134** | — | — | — | — | — |
| 135** | — | — | — | — | — |
| 136** | — | — | — | — | — |
| 137** | — | — | — | — | — |
| 138** | — | — | — | — | — |

Second Layer

| Sample No. | Composition (atomic %) | Condition | Face/Flank Thickness Ratio (K/L) | Total Number of Layers (a + b) | Life of Insert (m) |
|---|---|---|---|---|---|
| 105 | $(Ti_{50}Al_{50})N$ | A | 2.1 | 2 | 6.0 |
| 106 | $(Ti_{50}Al_{50})ON$ | A | 5.0 | 4 | 6.7 |
| 107 | $(Ti_{33}Al_{67})CN$ | A | 1.3 | 2 | 5.9 |
| 108 | $(Ti_{65}Al_{35})ON$ | A | 1.1 | 4 | 5.8 |
| 109 | $(Ti_{50}Al_{50})ON$ | A | 2.2 | 2 | 6.0 |
| 110 | $(Ti_{68}Al_{32})N$ | A | 4.1 | 6 | 6.2 |
| 111 | $(Ti_{50}Al_{50})CN$ | A | 2.3 | 8 | 6.0 |
| 112 | $(Ti_{64}Al_{34})ON$ | A | 1.1 | 4 | 5.8 |
| 113 | $(Ti_{55}Al_{45})N$ | A | 2.8 | 2 | 6.1 |
| 114 | $(Ti_{34}Al_{66})CN$ | A | 3.3 | 2 | 6.5 |
| 115 | $(Ti_{45}Al_{55})N$ | A | 3.0 | 10 | 6.2 |
| 116 | $(Ti_{68}Al_{32})N$ | A | 3.0 | 2 | 6.3 |
| 117 | $(Ti_{26}Al_{74})ON$ | A | 1.3 | 16 | 5.9 |
| 118 | $(Ti_{30}Al_{70})N$ | A | 2.3 | 2 | 6.0 |
| 119 | $(Ti_{50}Al_{50})CN$ | A | 2.5 | 2 | 6.1 |
| 120 | $(Ti_{64}Al_{36})ON$ | A | 1.3 | 2 | 5.9 |
| 121 | $(Ti_{50}Al_{50})N$ | A | 2.1 | 4 | 6.0 |
| 122 | $(Ti_{70}Al_{30})CON$ | A | 2.4 | 10 | 6.4 |
| 123 | $(Ti_{44}Al_{56})N$ | A | 2.0 | 2 | 6.0 |
| 124 | $(Ti_{43}Al_{57})ON$ | A | 1.2 | 4 | 5.9 |
| 125* | $(Ti_{50}Al_{50})N$ | A | 1.5 | 4 | 2.5 |
| 126* | $(Ti_{60}Al_{40})N$ | A | 1.3 | 2 | 2.7 |
| 127* | $(Ti_{37}Al_{63})N$ | A | 0.6 | 4 | 2.9 |
| 128* | $(Ti_{44}Al_{56})ON$ | A | 0.5 | 2 | 2.0 |
| 129* | $(Ti_{40}Al_{60})N$ | A | 0.8 | 2 | 2.9 |
| 130* | $(Ti_{65}Al_{35})CON$ | A | 0.9 | 6 | Peeled[1] |
| 131* | $(Ti_{50}Al_{50})N$ | A | 0.5 | 6 | 3.0 |
| 132** | $(Ti_{50}Al_{50})N$ | A | 0.2 | 2 | 1.1 |
| 133** | $(Ti_{50}Al_{50})N$ | A | 0.3 | 1 | 1.6 |
| 134** | $(Ti_{45}Al_{50}Si_5)N$ | A | 0.1 | 1 | 0.9 |
| 135** | $(Ti_{45}Al_{50}B_5)N$ | A | 0.2 | 1 | 1.0 |
| 136** | $(Ti_{34}Al_{54}Zr_8B_4)N$ | A | 0.3 | 1 | 1.8 |
| 137** | $(Ti_{40}Al_{60})ON$ | A | 0.4 | 1 | 1.8 |
| 138** | $(Ti_{55}Al_{35}Si_5B_5)N$ | A | 0.2 | 1 | 1.0 |

Note
*Comparative Examples.
**Conventional Examples.
[1]Peeled at early stage.

It is clear from the data of Examples shown in Table 8 that a half-value width of X-ray diffraction, a thickness ratio K/L, and a peak intensity ratio of h-BN to c-BN in Raman spectroscopy have large influence on cutting performance. Samples 105–124 of the present invention meeting these conditions exhibited drastically improved tool life. Particularly at the largest thickness ratio K/L of 5.0, and when other conditions of the hard coating layer were within the range of the present invention as in Sample 106 of the present invention, the tool life was remarkably improved than in Conventional Examples and Comparative Examples.

In Comparative Examples 125, 126 and 129, for instance, a peak intensity of c-BN is small in Raman spectroscopy, failing to meet the peak intensity ratio requirement of the present invention, even though the X-ray diffraction of the hard coating layer has a half-value width Z in a range of 0.3° to 0.6°. Accordingly, no improvement in extending the tool life was observed in Comparative Examples 125, 126 and 129 even as compared with Conventional Examples 132–138. Particularly in Comparative Examples 125 and 126, the face-to-flank thickness ratios K/L of the insert were 1.5 and 1.3, respectively, more than 1.0, failing to meet the conditions of Raman peak intensity ratio of the hard coating layer. Therefore, they did not exhibit sufficient cutting performance.

In Comparative Examples 127, 128 and 130, the hard coating layers did not meet the condition that the half-value width Z of X-ray diffraction was in a range of 0.3° to 0.6°. In addition, in Comparative Examples 127 and 130, the peeling of the hard coating layer took place at an early stage as a result of remarkable increase in internal stress, because of the increased peak intensity of c-BN in the Raman spectroscopy, which means that the hard coating layer contained fine crystals. This is because the face wear proceeded extremely, due to the fact that the hard coating layer did not meet the above conditions of the present invention, and that there was no optimum design of thickness ratios. Comparative Example 130 had the largest half-value width, indicating that it had a remarkably fine crystal structure. Accordingly, Comparative Example 130 was subjected to not only layer peeling at the early stage of cutting, but also large crater wear, resulting in early ending of its life.

Though Comparative Example 131 met the conditions of the present invention concerning the properties of the hard coating layer, its hard coating layer was thick on a flank of a tool, so that the hard coating layer failed to exhibit its own properties sufficiently. Thus, despite that Comparative Example 131 had about 2 times as long tool life as Conventional Examples, it did not have such a remarkable tool life as Samples of the present invention.

As shown in Table 8, because the hard coating layer of the present invention contained a BN crystal phase with its chemical structure controlled, it is excellent in seizure resistance and heat resistance, resulting remarkable improvement in tool performance. However, in Comparative Examples 125 and 128, for instance, only a trace amount of B was contained in their hard coating layers, so that B was introduced into a TiN crystal lattice in the form of a solid solution. As a result, the hard coating layer exhibited only insufficient improvement in tool performance, though it contained Ti and B.

In Comparative Examples 126, 127 and 129–131, the amount of B added exceeded 50 atomic %, though there was a BN crystal phase in the hard coating layer containing Ti and B. Accordingly, the hard coating layer easily peels off due to its own internal stress during a cutting operation. Particularly, the highest internal stress of about –6 GPa was observed in the hard coating layer of Comparative Example 130. When a cutting test was conducted by the hard layer-coated insert of Comparative Example 130, the large-scale peeling of the hard coating layer occurred on the flank and face of the tool at the early stage of cutting, resulting in the impossibility of continuing the cutting operation. This proves that remarkably excellent tool performance cannot be obtained, unless the BN crystal phase is contained in the hard coating layer, and unless the structure of the hard layer-coated tool including the amount of B added is optimally designed.

It was confirmed that any Samples of the present invention were superior in tool life to Conventional Example 132 having a two-layer structure of a (TiSi)N layer and a (TiAl)N layer, and Conventional Examples 133–138 having Zr, B and Si added as the third elements to the second layer of a (TiAl) nitride.

It has been found as a result of investigation of a reaction gas as one of the conditions of forming the hard coating layer of the present invention that the content of B is preferably 0.1 to 50 atomic %, based on the total amount (100 atomic %) of metal elements, in either of nitrides, carbonitrides, oxynitrides and olcorbcnitrides oxycarbonitrides each containing Ti and B as metal elements, to obtain an excellent seizure resistance. Taking into consideration the heat generation of a tool by friction with a work, etc., it is preferable to introduce a carbon-containing gas in addition to a nitrogen gas and an oxygen-containing gas to form a carbonitride or an oxycarbonitride.

Though the present invention has been explained in detail referring to Examples concerning inserts as tools, on which the hard coating layers of the present invention are formed, the present invention is not restricted thereto but may be applied to other high-efficiency cutting tools such as turning tools, etc.

As described above in detail, the hard layer-coated tool of the present invention is superior in crater wear resistance to conventional coated tools, thereby exhibiting drastically elongated tool life in a dry high-speed cutting operation than the latter. The hard layer-coated tool of the present invention having such features is extremely effective not only in improvement in the productivity and cost reduction of a cutting operation, but also in improvement in working environment, etc.

What is claimed is:

1. A tool coated with a hard layer made of any of a nitride, a carbonitride, an oxynitride and an oxycarbonitride each of which contains Ti and B as metal elements; wherein said hard coating layer contains a boron nitride phase; wherein the bonding energy of B and N is observed in an ESCA analysis of said hard coating layer; and wherein the existence of c-BN and h-BN is observed in a Rarnan spectroscopy of said hard coating layer.

2. The hard layer-coated tool according to claim 1, wherein a half-value width Z of a (200) face in an X-ray diffraction of said hard coating layer is in a range of 0.3° to 0.6°; wherein peaks of c-BN and h-BN are detected in an Raman spectroscopy of said hard coating layer; wherein a ratio $Q_1/Q_2$ of a peak intensity $Q_1$ of c-BN to a peak intensity $Q_2$ of h-BN is 1.0 or more; and wherein a ratio K/L of a face thickness K to a flank thickness L in said tool is 1.0 or more.

3. The hard layer-coated tool according to claim 1, wherein said hard coating layer is formed by using a target of a Ti-B alloy; and wherein the content of B in said hard coating layer is 0.1 to 50 atomic %, based on the total amount (100 atomic %) of metal elements.

4. The hard layer-coated tool according to claim 1, further comprising, as a layer other than said hard coating layer, a second hard coating layer either on said hard coating layer or on a surface of an insert substrate comprising at least one metal element selected from the group consisting of Ti, Al and Cr, and at least one non-metal element selected from the group consisting of C, O and N.

5. The hard layer-coated tool according to claim 4, wherein part of said metal element in the second hard coating layer containing Ti, Al and Cr is substituted, as a metal element other than said metal element, by at least one selected from the group consisting of metals in the Groups 4a, 5a and 6a and Si.

6. The hard layer-coated tool according to claim 1, wherein a tool substrate is made of cemented carbide or cermet; and wherein the total thickness of said hard coating layer is 3 to 15 μm in a tool face.

7. The hard layer-coated tool according to claim 1, wherein said tool is an insert.

8. The hard layer-coated tool according to claim 2, wherein said hard coating layer is formed by using a target of a Ti-B alloy; and wherein the content of B in said hard coating layer is 0.1 to 50 atomic %, based on the total amount (100 atomic %) of metal elements.

* * * * *